(12) United States Patent
Koh

(10) Patent No.: US 7,132,719 B2
(45) Date of Patent: Nov. 7, 2006

(54) SEMICONDUCTOR DEVICES AND METHODS OF FABRICATING THE SAME

(75) Inventor: Kwan-Ju Koh, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 1 day.

(21) Appl. No.: 10/917,141

(22) Filed: Aug. 12, 2004

(65) Prior Publication Data

US 2005/0035407 A1    Feb. 17, 2005

(30) Foreign Application Priority Data

Aug. 12, 2003    (KR) .................... 10-2003-0055789

(51) Int. Cl.
*H01L 29/76* (2006.01)
*H01L 21/336* (2006.01)

(52) U.S. Cl. .................. 257/408; 257/296; 257/412; 438/300; 438/303

(58) Field of Classification Search ........ 257/252–413, 257/133–145; 438/287–307
See application file for complete search history.

(56) References Cited

U.S. PATENT DOCUMENTS

| | | | |
|---|---|---|---|
| 5,168,072 A * | 12/1992 | Moslehi ................. | 438/300 |
| 5,627,097 A | 5/1997 | Venkatesan et al. ..... | 438/217 |
| 5,872,039 A | 2/1999 | Imai ..................... | 438/291 |
| 6,852,600 B1 * | 2/2005 | Wang et al. ............ | 438/301 |
| 6,872,626 B1 * | 3/2005 | Cheng ................... | 438/299 |
| 6,902,980 B1 * | 6/2005 | Wang et al. ............ | 438/305 |

* cited by examiner

*Primary Examiner*—H. Jey Tsai
(74) *Attorney, Agent, or Firm*—Andrew D. Fortney

(57) ABSTRACT

As disclosed herein, a semiconductor device includes a gate and a silicon substrate having a field region and an active region. A gate dielectric layer formed on the upper surface of the active region of the silicon substrate and on a gate dielectric layer. The gate may include first and second sidewall dielectric layers sequentially formed on sidewalls of the gate, epitaxial silicon layers formed at both sides of the gate on the silicon substrate, first LDD regions formed in the silicon substrate below the second sidewall dielectric layers, second LDD regions formed at one sides of the first LDD regions below the epitaxial silicon layers, source/drain regions formed under the second LDD regions, and silicide layers formed on the gate and the source/drain regions.

16 Claims, 3 Drawing Sheets

SEMICONDUCTOR DEVICES AND METHODS OF FABRICATING THE SAME

TECHNICAL FIELD

The present invention relates to semiconductor devices and, in particular, to semiconductor devices capable of stably operating a gate, and methods for fabricating the same.

BACKGROUND

As semiconductor devices have become highly integrated, the line width and spaces of the various patterns for devices has been reduced. This is especially true with regard to the design rule of the gate of transistor, which has become so highly integrated that the gate length has been shortened.

Conventionally, to reduce the delay time of the signal, low resistivity materials are widely used. In particular, there has been much research and development regarding the use of silicide material for reducing the sheet and contact resistance of the gate and source/drain of transistors.

In the conventional silicide process, firstly lightly doped drain (LDD) and source/drain regions formed on a silicon substrate and silicide reactive material such as nickel (Ni), cobalt (Co), Platinum (Pt), titanium (Ti) and etc. are sputtered and annealed, for reducing the resistance of the source/drain regions and the gate, such that the sputtered material reacts with the silicon (Si) on the surface of the source/drain and gate, whereby the silicide layer is formed on the source/drain and gate.

In the conventional method, however, the silicon on the source/drain and gate is consumed for forming the silicide layer, which can cause junction leakage. That is, the silicon consumption allows the dopant to spread into the junction as the silicide layer is formed, so as to change the distribution of the junction, resulting in the junction leakage. Also, the low dopant concentration on the surface of the silicide layer caused by the spread of the dopant increases the contact resistance.

Accordingly, it is required to develop a technique for protecting the junction leakage caused by the consumption of the silicon on the source/drain and gate surfaces.

U.S. Pat. Nos. 5,872,039 and 5,627,097 have disclosed methods for reducing the spread region of the source/drain region by forming an epitaxial layer on the device region and forming a channel region using the epitaxial layer, respectively.

DETAILED DESCRITPION

Figure 1:
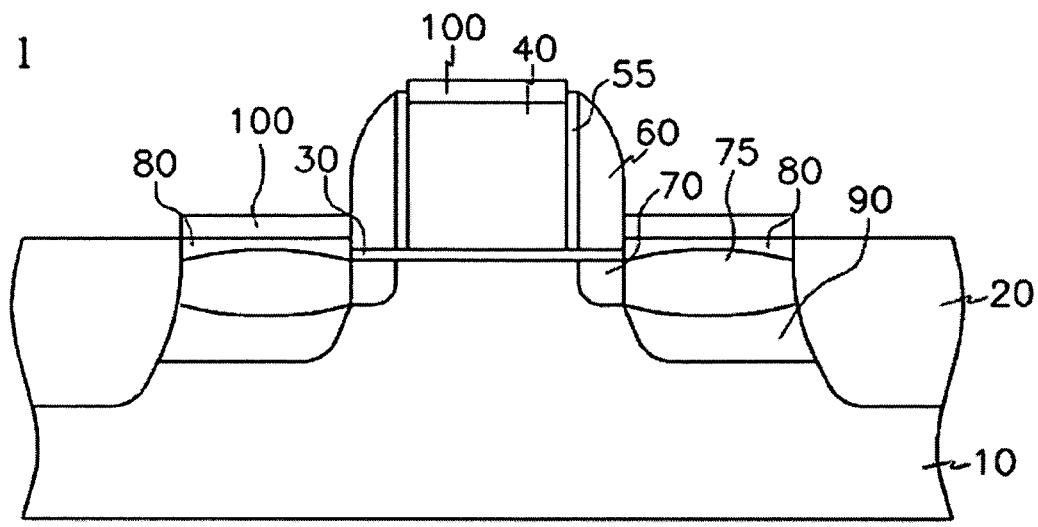
FIG. 1 is a cross sectional view illustrating a disclosed semiconductor device.

To clarify the disclosure regarding multiple layers and regions, the thicknesses of the layers are enlarged in the drawings. Wherever possible, the same reference numbers are used throughout the drawing(s) to refer to the same or like parts. When it is said any part such as a layer, film, area, or plate is positioned "on another part," it means the part is right on the other part or above the other part with at least one intermediate part. Additionally, when it is said that any part is positioned "right on another part" it means that there is no intermediate part between the two parts.

As shown in FIG. 1, a silicon substrate 10 has a field region and an active region. A memory gate 40 is formed on a gate dielectric layer 30 of the active region, which has first and second sidewall dielectric layers 55 and 60. According to one example, the memory gate 40 is formed from polysilicon. The active region includes a first LDD region 70 formed by ion implanting using the first sidewall dielectric layer 55 as a mask and a second LDD region 75 formed by ion implanting using the second sidewall dielectric layer 60 as a mask.

Below the second LDD regions 75, source/drain regions 90 are formed by doping n- or p-type conductive impurity ion and an epitaxial silicon layer 80 is formed on the second LDD regions 75.

A silicide layer 100, such as nickel silicide, cobalt silicide, platinum silicide, titanium silicide and etc. is formed on the epitaxial silicon layer 80 corresponding to the second LDD region 75 and the memory gate 40.

One technique for fabricating semiconductor devices is described below in conjunction with the accompanying drawings. FIG. 2A to FIG. 2E are cross-sectional views illustrating semiconductor devices at various fabrication steps of the method.

Figure 2A:
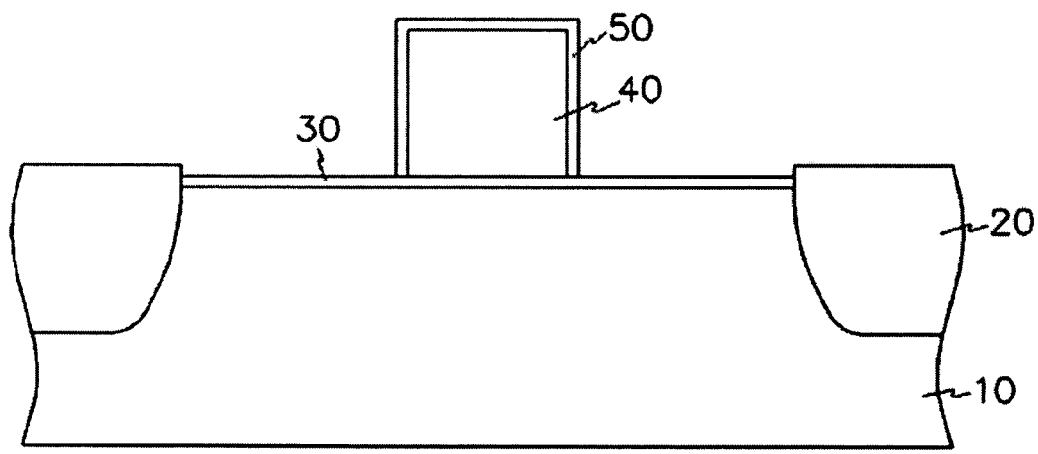
FIG. 2A to FIG. 2E are cross-sectional views illustrating the disclosed semiconductor at various fabrication stages.

As shown in FIG. 2A, a field oxide layer 20 is formed on a silicon substrate 10 so as to defined a field region and an action region using local oxidation of silicon (LOCOS) or shallow trench isolation (STI) techniques. Next, a gate dielectric layer 30 of oxide is formed on the active region of the silicon substrate 100. And then, a memory gate 40 of polysilicon is formed by depositing a polysilicon layer (now shown) on the gate dielectric layer 30 and then selectively removing the polysilicon layer through an etching process.

Figure 2B:
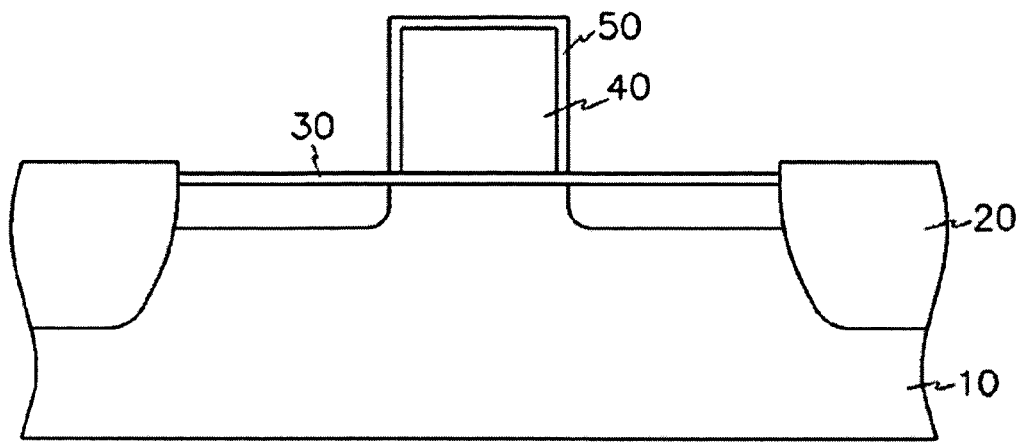

Sequentially, an oxide layer 50 is formed around the memory gate by oxidizing the entire surface of the silicon substrate on which the memory gate 40 is formed. As shown in FIG. 2B, first LDD regions are formed in the silicon substrate 10 at both sides of the memory gate 40 by implanting ion for forming the LDD into the silicon substrate 10 using the oxide layer 50 as a mask.

Figure 2C:
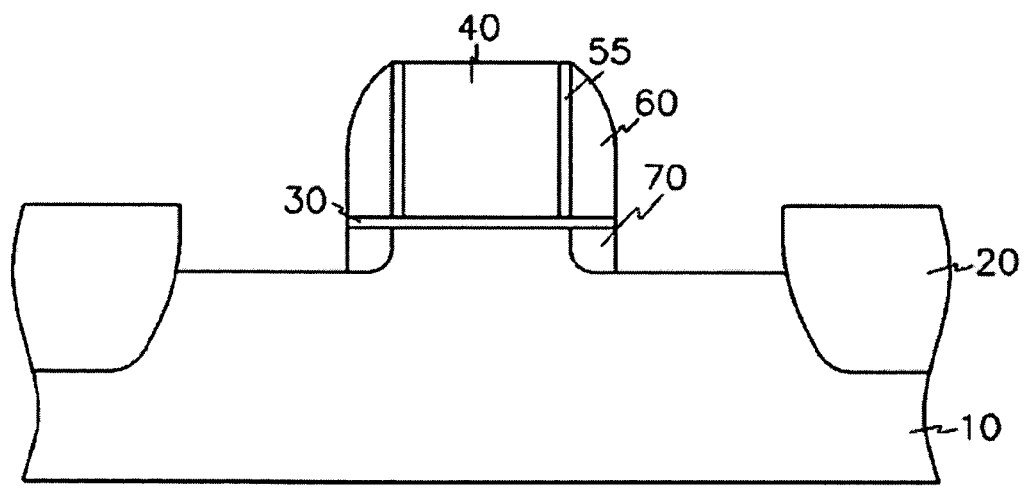

Subsequently, as shown in FIG. 2C, first side wall dielectric layers 55 are formed on both sidewalls of the memory gate 40 by selectively etching the oxide layer 50 formed on the upper surface of the memory gate 40 and the remaining oxide layer formed at the sides of the memory gate 40.

A second sidewall dielectric layer 60 is formed at one side of each first sidewall dielectric layer 55 by depositing a dielectric material such as oxide or nitride on the entire surface of the silicon substrate such that the double layer structured sidewall dielectric layers, each consists of the first and second sidewall dielectric layers 22 and 60, are formed.

Figure 2D:
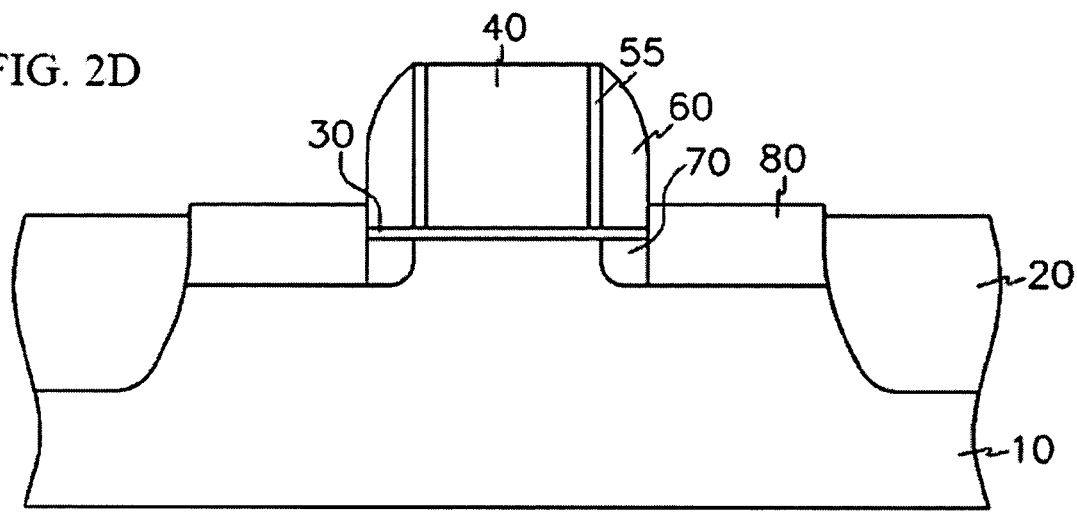

As shown in FIG. 2D, an epitaxial silicon layer 80 is formed on the exposed silicon substrate 10 using the selective epitaxial growth (SEG), which forms single crystals or which direction is identical with the direction of the silicon substrate 10. Here, the epitaxial silicon layer 80 is not grown on the field region of the silicon substrate formed by the field oxide layer 20. On the other hand, in an active region of the silicon substrate 10, the epitaxial silicon layer 80 having the characteristic identical with the silicon substrate is formed. Also, the epitaxial silicon layer 80 is formed on the silicon substrate so as to its height is higher than that of the field oxide layer 20, whereby it is possible to obtain a margin to be consumed at the silicide process. Preferably the epitaxial silicon layer 80 is formed at a thickness in the range of 100~1000 Å.

Figure 2E:
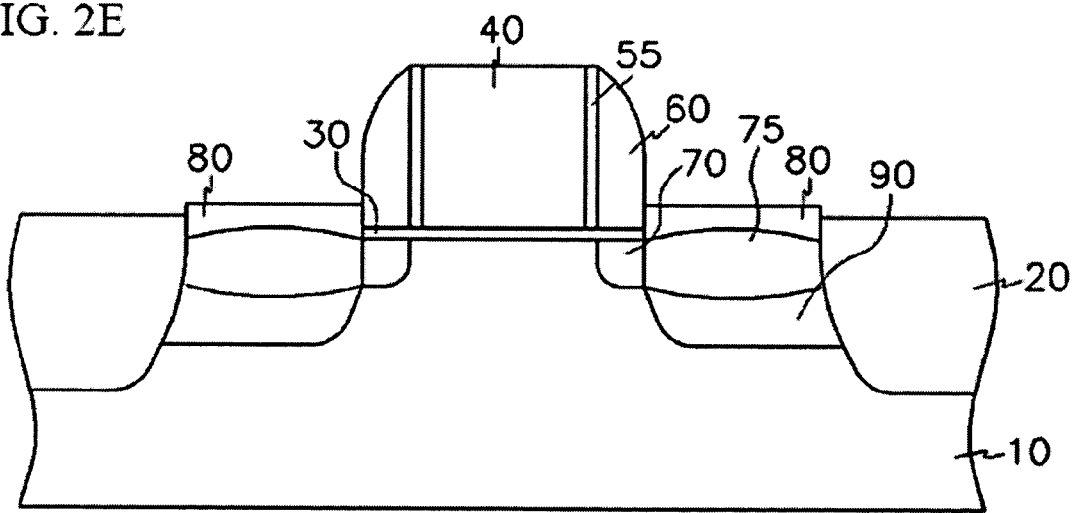

Next, as shown in FIG. 2E, second LDD regions 75, and the source/drain region 90 are formed by sequentially implanting an LDD-forming ion and a source/drain-forming ion such as n- or p-type conductive impurity ion using the memory gate 40 as a mask. Here, the implanting dose of the LDD-forming ion and the source/drain-forming ion and the implanting energy can be adjusted according to the thickness of the silicon epitaxial silicon layer 80.

Consequentially, as shown in FIG. 1, a silicide reactive material is deposited on the upper surface of the memory gate and the epitaxial silicon layer 80 corresponding to the source/drain regions 90. Here, the silicide reactive material can be one of various metal elements such as nickel, cobalt, platinum, titanium and etc., and titanium is one example. Next, a titanium silicide layer ($TiSi_2$) 100 is formed on the upper surface of the memory gate 40 and the surface of the epitaxial silicon layer 80 by annealing the silicon substrate 10. Also, the titanium silicide layer ($TiSi_2$) at the positions corresponding to the source/drain regions 90 is formed by reacting the silicon forming the epitaxial silicon layer 80 with the titanium such that the titanium silicide 100 is thickly formed.

As disclosed above, a titanium silicide layer is formed by reacting the silicon of the epitaxial silicon layer and the titanium at the positions corresponding to the source/drain regions, such that the titanium silicide layer is formed thickly, whereby it is possible to reduce the sheet resistance and reduce the loss of the LDD region and the source/drain regions. Accordingly, it is possible to protecting the junction leakage effects so as to stabilize device characteristic and operation.

The disclosed techniques provide a semiconductor device and a method for fabricating the same, which are capable of stabilizing the operation of a gate by forming a silicide layer on the source/drain and gate without consumption of the silicon on the surface of the source/drain and gate.

As disclosed herein the semiconductor gate device includes a silicon substrate having a field region and an active region, a gate dielectric layer formed on the upper surface of the active region of the silicon substrate, a gate formed on the gate dielectric layer, first and second sidewall dielectric layers sequentially formed on sidewalls of the gate. According to this arrangement, epitaxial silicon layers formed at both sides of the gate on the silicon substrate, first LDD regions formed in the silicon substrate below the second sidewall dielectric layers, second LDD regions formed at one sides of the first LDD regions below the epitaxial silicon layers, source/drain regions formed under the second LDD regions, and silicide layers formed on the gate and the source/drain regions.

Also, as disclosed herein, a method for fabricating a semiconductor gate device may include defining a field region and an active region on a silicon substrate, depositing a gate dielectric layer and a gate layer sequentially, and forming a gate by patterning the gate layer. The method may also include forming first sidewall dielectric layers by oxidizing sidewalls of the gate, forming first LDD regions on the silicon substrate using the first sidewall dielectric layers and the gate, forming second sidewall dielectric layers as spacers on one sides of the first dielectric layers, exposing the silicon substrate by partially etching the first LDD regions using the second sidewall dielectric layers as a mask, forming epitaxial silicon layers on the exposed silicon substrate through an selective epitaxial growth process, forming second LDD regions and source/drain regions by injecting ion into the epitaxial silicon layers, and forming silicide layers on the surfaces of the gate and the epitaxial silicon layers through a silicide process.

According to one example, forming the silicide may include sputtering a silicide reactive material on surface of the gate and the epitaxial silicon layers and annealing the silicon substrate on which the silicide reactive material is sputtered. Preferably the silicide reactive material may be selected from one from among nickel, cobalt, platinum, and titanium.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A semiconductor gate device, comprising:
   a silicon substrate having a field region and an active region;
   a gate dielectric layer on an upper surface of the active region of the silicon substrate;
   a gate on the gate dielectric layer;
   first and second sidewall dielectric layers on sidewalls of the gate;
   epitaxial silicon layers at both sides of the gate in trenches in the silicon substrate;
   first LDD regions in the silicon substrata below the second sidewall dielectric layers;
   second LDD regions at one side of the first LDD regions in the epitaxial silicon layers;
   source/drain regions under the second LDD regions;
   silicide layers on the gate and the second LDD regions; and
   a field oxide layer in the field region, wherein a bottom surface of the silicide layers and an upper surface of the field oxide layer are higher than the upper surface of the silicon substrate under the gate dielectric layer, and an upper surface of the epitaxial silicon layers is higher than the upper surface of the field oxide layer.

2. The semiconductor gate device of claim 1, wherein each of the silicide layers comprises a material selected from the group consisting of titanium silicide, cobalt silicide, nickel silicide, and platinum silicide.

3. A method for fabricating a semiconductor gate device, comprising:
   defining a field region and an active region on a silicon substrate by forming a field oxide layer in the field region;
   depositing a gate dielectric layer and a gate layer sequentially;
   forming a gate by patterning the gate layer;
   forming first sidewall dielectric layers by oxidizing sidewalls of the gate;
   forming first LDD regions on the silicon substrate using the first sidewall dielectric layers and the gate;
   forming second sidewall dielectric layers as spacers on one side of the first dielectric layers;
   partially etching the first LDD regions using the second sidewall dielectric layers as a mask, to expose the silicon substrate and form a trench therein;
   forming epitaxial silicon layers on the exposed silicon substrate through a selective epitaxial growth process such that an upper surface of the epitaxial silicon layers is higher than an upper surface of the field oxide layer;
   forming second LDD regions and source/drain regions by injecting ions into the epitaxial silicon layers; and forming silicide layers on surfaces of the gate and the epitaxial silicon layers trough a silicide process, wherein a bottom surface of the silicide layers and an upper surface of the field oxide layer are higher than an upper surface of the silicon substrate under the gate dielectric layer, and an upper surface of the epitaxial silicon layers is higher than the upper surface of the field oxide layer.

4. The method of claim 3, wherein the forming the silicide layers comprises:

sputtering a silicide reactive material on an upper surface at the gate and the epitaxial silicon layers; and annealing the silicon substrate on which the silicide reactive material is sputtered.

5. The method of claim 4, wherein the silicide reactive material is selected from the group consisting of nickel, cobalt, platinum and titanium.

6. The method of claim 3, wherein the epitaxial silicon layer is formed at a thickness in the range of 100~1000 Å.

7. The semiconductor gate device of claim 1, wherein the gate comprises polysilicon.

8. A memory device, comprising the semiconductor gate device of claim 1.

9. The method of claim 6, wherein the thickness of the epitaxial silicon layer provides margin for consumption during the silicide layer forming step.

10. The method of claim 6, wherein the forming the second LDD regions and the source/drain regions comprises implanting ions at a dose and/or an implanting energy based on the thickness of the epitaxial silicon layer.

11. The method of claim 3, wherein the forming to field oxide layer comprises local oxidation of silicon (LOCOS).

12. The method or claim 3, wherein the forming the field oxide layer comprises a shallow trench isolation (STI) process.

13. The method of claim 3, wherein the gate layer comprises polysilicon.

14. The method of claim 3, wherein the forming the second sidewall dielectric layers comprises depositing a dielectric material on a surface of the silicon substrate, and etching the dielectric material.

15. The method of claim 14, wherein the dielectric material comprises an oxide or a nitride.

16. The method of claim 3, wherein the silicide process comprises annealing.

* * * * *